(12) United States Patent
Lim et al.

(10) Patent No.: US 8,330,354 B2
(45) Date of Patent: Dec. 11, 2012

(54) ORGANIC LIGHT EMITTING DIODE DISPLAY DEVICE

(75) Inventors: Hyun Taek Lim, Busan (KR); Bock Hyun Chung, Gwangmyeong-si (KR); Ho Chul Lee, Gumi-si (KR)

(73) Assignee: LG Display Co. Ltd., Seoul (KR)

( * ) Notice: Subject to any disclaimer, the term of this patent is extended or adjusted under 35 U.S.C. 154(b) by 132 days.

(21) Appl. No.: 12/327,393

(22) Filed: Dec. 3, 2008

(65) Prior Publication Data

US 2009/0302746 A1 Dec. 10, 2009

(30) Foreign Application Priority Data

Jun. 4, 2008 (KR) .................. 10-2008-0052758

(51) Int. Cl.
*H01L 51/50* (2006.01)
(52) U.S. Cl. ........................................ 313/504
(58) Field of Classification Search ............ 313/504
See application file for complete search history.

(56) References Cited

U.S. PATENT DOCUMENTS

| | | | | |
|---|---|---|---|---|
| 2002/0070663 A1* | 6/2002 | Ogura et al. | ............ | 313/506 |
| 2002/0180349 A1* | 12/2002 | Aziz et al. | ............ | 313/506 |
| 2004/0174116 A1* | 9/2004 | Lu et al. | ............ | 313/506 |
| 2005/0140289 A1* | 6/2005 | Park et al. | ............ | 313/506 |
| 2007/0132374 A1* | 6/2007 | Park | ............ | 313/504 |
| 2007/0152222 A1* | 7/2007 | Joo | ............ | 257/72 |
| 2008/0111484 A1* | 5/2008 | Kwon et al. | ............ | 313/506 |

FOREIGN PATENT DOCUMENTS

CN 1653853 8/2005

OTHER PUBLICATIONS

Office Action issued in corresponding Chinese Patent Application No. 200810189432.6; issued Jun. 12, 2010.

* cited by examiner

*Primary Examiner* — Anh Mai
*Assistant Examiner* — Andrew Coughlin
(74) *Attorney, Agent, or Firm* — Brinks Hofer Gilson & Lione (57) ABSTRACT

An OLED adapted to ensure the reliability and improve the lifespan and to improve an electric contact characteristic between a drive element and an organic light emission diode is disclosed. The OLED device includes: first and second substrates, opposite to each other at a interval, sealed by a sealant; driver elements arranged on the inner surface of the first substrate; organic light emission diode elements, arranged on the inner surface of the second substrate, each including a contact portion upwardly protruding from this substrate; and gather electrodes arranged on the second substrate including the organic light emission diode elements and formed of an electrically conductive gather material and an oxidation-resistant electrically conductive material having an oxidative index lower than that of the electrically conductive gather material.

9 Claims, 5 Drawing Sheets

ORGANIC LIGHT EMITTING DIODE DISPLAY DEVICE

RELATED APPLICATIONS

This application claims priority under 35 U.S.C. 119 to Korean Patent Application No. 10-2008-0052758, filed on Jun. 4, 2008, which is hereby incorporated by reference in its entirety.

BACKGROUND

1. Field of the Disclosure

This disclosure relates to an organic electro-luminescent display device, and more particularly to an organic electro-luminescent display device of dual panel type adapted to ensure the reliability and to improve the lifespan and an electric contact characteristic between a drive element and an organic light emission element.

2. Description of the Related Art

Display devices have been developed along with the development of information communication and have became a modern-day necessity. Of the display devices, organic electro-luminescence display (OLED) devices can be light and slim since they do not need the backlight units required for liquid crystal display devices. Also, the OLED devices can be manufactured through a simple process and thus have competitive prices. Moreover, the OLED devices have a low voltage drive, a high luminous efficiency, and a wide viewing angle. In view of these points, the OLED devices have received a growing amount of attention as one of next-generation display devices.

The OLED devices fundamentally include an organic light emission diode element consisting of an anode electrode, a cathode electrode, and an organic light emission layer interposed between the anode and cathode electrodes. The organic light emission diode element uses a luminous principle which involves combining excitation leptons (or particles) such as a free hole and an electron. The combination of a free hole and an electron allows them to transit from a state of instability to a stable status, and in doing so, emit light. In other words, the organic light emission diode element generates free holes in the anode electrode and free electrons in the cathode electrode so that the free holes and electrons from the anode and cathode electrodes can be recombined with each other in the organic light emission layer, thereby emitting light.

The organic light emission layer easily deteriorates under exposure of either oxygen or moisture causing defects such as dark spots and dark pixels in the OLED device. The dark spots are viewed by users because some pixels displaying an image are not luminous. The dark pixel means that at least one among a plurality of pixels is not luminous.

To address these defects, an OLED device has been proposed which includes organic light emission diode elements sealed by both a seal substrate and a UV (ultra violet ray) hardening resin and are thus shielded from the external environment. However, the seal substrate and UV hardening resin cannot completely seal the organic light emission diode elements. In other words, the seal substrate and UV hardening resin do not substantially shield either external moisture or oxygen from intruding into the organic light emission diode elements. Accordingly, the organic light emission diode elements may deteriorate over time.

Another alternative has been proposed which inserts a gather into an OLED device. This gather eliminates at least partially eliminates intruding moisture and oxygen, thus ensuring the reliability and improving the lifespan of the device. It is spatially difficult to include the gather in a dual panel type OLED device including driver elements and organic light emission diode elements which are formed in substrates. Accordingly, the deterioration of the organic light emission layer caused by moisture and/or oxygen is aggravated in the dual panel type OLED device.

BRIEF SUMMARY

According to one general aspect of the present disclosure, an OLED device includes: first and second substrates, opposite to each other at an interval, sealed by a sealant; driver elements arranged on the inner surface of the first substrate; organic light emission diode elements, arranged on the inner surface of the second substrate, each including a contact portion upwardly protruding from this substrate; and gather electrodes arranged on the second substrate including the organic light emission diode elements and formed of an electrically conductive gather material and an oxidation-resistant electrically conductive material having an oxidative index lower than that of the electrically conductive gather material.

An OLED device according to another aspect of the present disclosure includes: a first electrode disposed a first substrate; a buffer pattern, disposed on the first electrode, exposing the light emission region of each pixel; a separator disposed on the buffer pattern surrounding each pixel; a protrusion member disposed on the buffer pattern within the region defined by the separator; an organic light emission layer disposed opposite at least the light emission regions on the first electrode; second electrodes, disposed on the organic light emission layer and separated in the pixels by means of the separator, each including a contact portion which covers the respective protrusion member; gather electrodes disposed on the second electrodes and formed of an electrically conductive gather material and an oxidation-resistant electrically conductive material having an oxidative index lower than that of the electrically conductive gather material; and a second substrate, opposite to the first substrate, including driver elements each electrically contacting a portion of the gather electrode which protrudes by the respective contact portion.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION OF THE DRAWINGS AND THE PRESENTLY PREFERRED EMBODIMENTS

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

Figure 1:
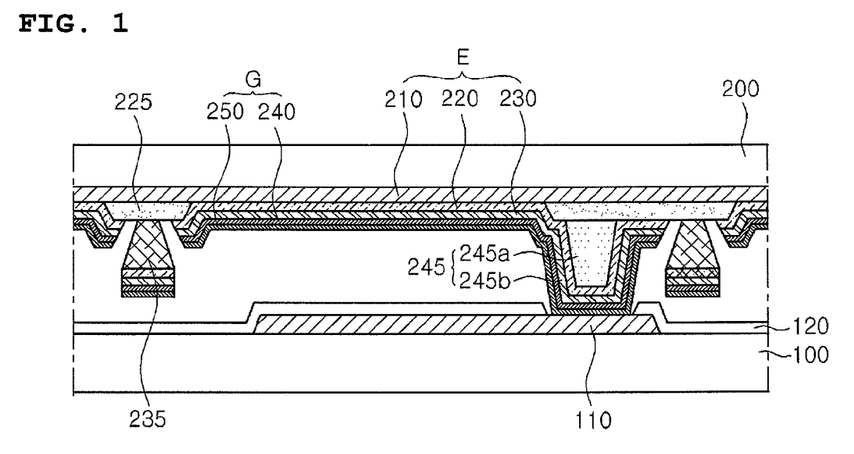
FIG. 1 is a cross-sectional view showing an OLED device according to a first embodiment of the present disclosure.

FIG. 1 is a cross-sectional view showing an OLED device according to a first embodiment of the present disclosure. The OLED device of the first embodiment includes a plurality of pixels, but FIG. 1 largely shows only one among these plural pixels for convenience of explanation.

Referring to FIG. 1, the OLED device according to a first embodiment of the present disclosure includes first and second substrates 100 and 200 in which driver elements 110 and organic light emission diode elements E are disposed respectively. The first and second substrates 100 and 200 are faced toward each other at a fixed interval. Also, the first and second substrates 100 and 200 are combined with each other using a sealant (not shown). In the space between the sealed first and second substrates 100 and 200, the organic light diode elements E and the driver elements 110 are arranged to being electrically connected to each other.

The driver elements 110 may be arranged in a plurality of pixel regions into which the inner surface of the first substrate 100 is divided by the intersection of gate lines and data lines. Also, each of the driver elements 110 may include: a switching thin film transistor selecting a corresponding pixel; a driver thin film transistor, responsive to an electric signal (for example, a data signal) from the switching thin film transistor, enabling the organic light emission diode element E to emit light; and a capacitor maintaining the electric signal during a fixed period.

On the first substrate 100 which includes the driver element 110, a protective film 120 is disposed. The protective film 120 exposes a part of the driver element 110, which will be in contact with the organic light emission diode element E, i.e., a part of the output terminal of the driver thin film transistor. Such a protective film 120 has the function of protecting the driver element 110.

The second substrate 200 includes the organic light emission diode elements E arranged in a matrix shape on the inner surface of the second substrate 200 and a gather electrode G disposed on the organic light emission diode elements E.

The organic light emission diode elements E each include a first electrode 210, an organic light emission layer 220, and a second electrode 230 sequentially stacked on the inner surface of the second substrate 200. The organic light emission diode elements E further include contact portions 245 protruding upwardly and electrically connected to the respective second electrodes 230.

The first electrode 210 is disposed to be shared by a plurality of pixels which will be defined on the second substrate 200. Also, the first electrode 210 may be formed of a transparently conductive material, such as an ITO (indium-tin-oxide) or an IZO (indium-zinc-oxide), capable of transmitting light. Such a first electrode 210 applies first electric charges to the organic light emission layer 220.

On the first electrode 210, there is a buffer pattern 225 which exposes the light emission region of each pixel. In other words, the light emission regions are defined by the buffer pattern 225. The buffer pattern 225 may be formed from an insulating material, for example, silicon oxide or silicon nitride.

A separator 235 is disposed along the area surrounding each pixel on the buffer pattern 225. In other words, the separator 235 may define the pixels. The separator 235 also has the function of dividing the second electrode 230, which will be described below, into each pixel. Furthermore, the separator 235 disposed along the area surrounding each pixel can have the cross-sectional shape of a reversed trapezoid.

The contact portions 245 are arranged on the buffer pattern 225 and are protruding upwardly from it. The contact portions 245 are also positioned in the respective pixel regions which are defined by the separator 235. Furthermore, the contact portions are extended to the respective driver elements 210 in order to electrically connect the organic light emission diode elements E and the corresponding driver elements 210 which are separated from each other.

Such contact portions 245 may each include a protrusion member 245a and a contact electrode 245b covering the outer surface of the protrusion member 245. The protrusion member 245a has a pillar shape protruding toward the driver element 210, i.e., in the upward direction from the contact portion 245. As such, the contact portion 245 can protrude in its upward direction. The contact electrode 245b is electrically connected to the second electrode 230 which will be described below. The contact electrode 245b is formed in a single body united with the second electrode 230 which will be described below. As a result, the contact portion 245 is in contact with the driver 210 so that driver elements 210 and the organic light emission diode elements E are electrically connected to each other.

The organic light emission layer 220 is disposed on the first electrode 210 corresponding to the light emission region. The organic light emission layer 220 may selectively cover the protrusion member 245a depending on a mask shape for its formation. In other words, the organic light emission layer 220 can be interposed between the protrusion member 245a and the contact electrode 245b, but is not limited to this. For example, the organic light emission layer 220 can be formed to expose the protrusion member 245a. This organic light emission layer 220 generates light through a recombination of the first electric charges from the first electrode 210 with second electric charges from the second electrode 230.

The second electrode 230 is disposed on the organic light emission layer 220. The second electrode 230 is also divided into each pixel by means of the separator 235. Furthermore, the second electrode 230 is electrically connected to the contact electrode 245*b*, as described above. For convenience of the manufacturing processes, the second electrode 230 can be united with the contact electrode 245*b* in a single body.

Such a second electrode 230 applies the second electric charges to the organic light emission layer 220. The second electric charge may be an electron. To this end, the second electrode 230 may be formed from a conductive material which has a work function lower than that of the first electrode 210. Moreover, the second electrode 230 may be formed from a conductive material having a superior reflectance in order to reflect light from the organic light emission layer 220. Consequently, the second electrode 230 can be formed of at least one of Al, Ag, Cu, Au, Li, Ca, Ba, and Hg.

In this manner, as the second electrode 230 is formed from reflective material, the organic light emission diode element E emits light, which is generated in the organic light emission layer 220 through the second substrate 200 and applies an image to users. As such, the OLED device according to the first embodiment of the present disclosure can prevent a decrement in aperture ratio due to the driver element 110. In other words, the OLED device can allow the driver element 110 to be freely designed regardless of the aperture ratio.

In order to improve its light-efficiency, the organic light emission diode element E further includes an additional organic layer which is not shown in the drawings. For example, the additional organic layer can include at least one among a first electric charge injection layer, a first electric charge transportation layer, a second electric charge injection layer, and a second electric charge transportation layer. The first electric charge injection and transportation layers are interposed between the second electrode 230 and the organic light emission layer 220. The second electric charge transportation and injection layers are interposed between the organic light emission layer 220 and the first electrode 210.

The gather electrode G removes at least one of moisture and oxygen from within the sealed space and prevents the organic light emission diode element E from deteriorating by moisture and oxygen. To this end, the gather electrode G disposed on the organic light emission diode element E is formed of an electrically conductive gather material. In other words, the gather electrode G has the function of eliminating moisture and oxygen, as well as the electric conductivity. As such, the gather electrode G can be formed on the contact portion 245. Part of the gather electrode G disposed on the contact portion 245 may electrically connect the driver element 110 with the contact portion 245. Accordingly, the gather electrode G does not need an additional mask exposing the contact portion 245. As a result, the gather electrode G can prevent an increase in the number of manufacturing processes and also avert a contact defect between the driver element 110 and the contact portion 245 caused by the misalignment of the mask.

However, the electrically conductive gather material forming the gather electrode G is oxidized in order to eliminate moisture and oxygen. This electrically conductive gather material may include at least any one of Ca, Sr, Ba, CaO, and BaO. The oxidation of the gather electrode G may increase the electric contact resistance between the organic light emission diode element E and the driver element 110, thereby causing an electric contact defect between them. Due to this, the OLED device may provide an image of defective quality which includes dark spots and pixels and may furthermore deteriorate its reliability. Also, the oxidation of the gather electrode G spreads to the second electrode 230 causing the deterioration of the organic light emission diode element E. Moreover, the electrically conductive gather material can force the surface of the organic light emission diode element E to be deteriorated in characteristic. The characteristic deterioration of the surface may lower the electric contact characteristic between the organic light emission diode element E and the driver element 110.

To solve these problems, the gather electrode G can be formed to expose the contact portion 245. In this case, a photolithography process for etching the gather electrode G can further be added.

In another option for improving the electric contact characteristic, the gather electrode G can further include an oxidation-resistant electrically conductive material. For example, the gather electrode G can be formed in a stacked layer which includes a first gather electrode 240 formed of the oxidation-resistant electrically conductive material and a second gather electrode 250 formed of the electrically conductive gather material. The oxidation-resistant electrically conductive material has an oxidative capacity lower than that of the electrically conductive gather material. As such, although the electrically conductive gather material of the gather electrode G (i.e., the second gather electrode 250) is oxidized, the oxidation-resistant electrically conductive material of the gather electrode G (i.e., the first gather electrode 240) can maintain the conductivity of the gather electrode G, thereby preventing the electric contact defect between the organic light emission diode element E and the driver element 110. Also, the first gather electrode 240 prevents the oxidation of the second gather electrode 250 from spreading to the second electrode 230.

Moreover, the oxidation-resistant electrically conductive material can include a material having features such as a superior thin film property, an easily-formed thin film, and high conductivity, in order to prevent the electric contact characteristic between the organic light emission diode element E and the driver element 110. Furthermore, the oxidation-resistant electrically conductive material can include a material not affecting the electric characteristic of the second electrode 230 upon being in contact with the second electrode 230. Consequently, the oxidation-resistant electrically conductive material may include a fluoride metal or an electrically conductive organic material. As the fluoride metal, any one among $LiF$, $LiF_2$, $MgF_2$, and so on can be used.

The first gather electrode 240 may be formed in a thickness of about 5 μm~100 μm. This is due to the fact that a first gather electrode 240 formed in a thickness of less than 5 μm cannot maintain the electric conductivity of the contact portion 245 following the oxidation of the second gather electrode 250 and does not prevent the electric contact defect between the driver element 110 and the organic light emission diode element E. On the other hand, a first gather electrode 240 formed in a thickness of more than 100 μm may not be conductive and may cause the contact defect between the driver 110 and the organic light emission diode element E.

To minimize the influence of its thickness, the first gather electrode 240 may further include an electrically conductive metal. In other words, the first gather electrode 240 can be a co-deposition layer of the oxidation-resistant electrically conductive material and the electrically conductive material. The electrically conductive metal may be a material capable of being mixed well with the oxidation-resistant electrically conductive material. For example, the electrically conductive metal may include at least one among Al, Ag, Au, and Li.

On the other hand, the electrically conductive organic material may be any one among polypyrrole, polyaniline, polythiopene, and so on. Alternatively, the organic material forming the organic light emission layer 220 or the organic layer can be used as the electrically conductive organic material. As such, the organic layer may be composed of the first electric charge injection layer, the first electric charge transportation layer, the second electric charge transportation layer, and the second electric charge injection layer as described above. Actually, the organic material may be any one among "copper phthalocyanine" (CuPc), "N,N'-Di(naphthalene-1-yl)-N,N'-diphenyl-benzidine" (NPB), "tris-8-hydroxyquinoline aluminum" (Alq3), "4,4',4''-tris(3-methylphenyl-N-phenylamino)triphenylamine" (NTDATA), and LGC101 manufactured by LG Chemical Ltd. In this case, the first gather electrode 240 may be formed in a thickness range of about 50 μm~2000 μm, in order to maintain the electric conductivity (or the electrically conductive characteristic) between the driver element 110 and the organic light emission diode element E and prevent the second electrode 230 of the organic light emission diode element E from being oxidized.

In the OLED device according to the first embodiment of the present disclosure, the gather electrode G is explained as a stacked-layer structure of the electrically conductive gather material and the oxidation-resistant electrically conductive material, but is not limited this. For example, the gather electrode G can be formed by co-depositing the electrically conductive gather material and the oxidation-resistant electrically conductive material.

As thus described, the OLED device according to the first embodiment of the present disclosure includes a gather electrode removing moisture and oxygen so that the lifespan and reliability can be improved. Also, since the gather electrode includes the oxidation-resistant electrically conductive material, the OLED device can prevent the oxidation of the second electrode and can provide a stable electric contact characteristic between the organic light emission diode element and the driver element. Moreover, the OLED device does not require an additional photolithography process to expose the contact portion which electrically contacts the organic light emission diode element with the driver element, because of the electric conductivity of the gather electrode.

Figure 2:
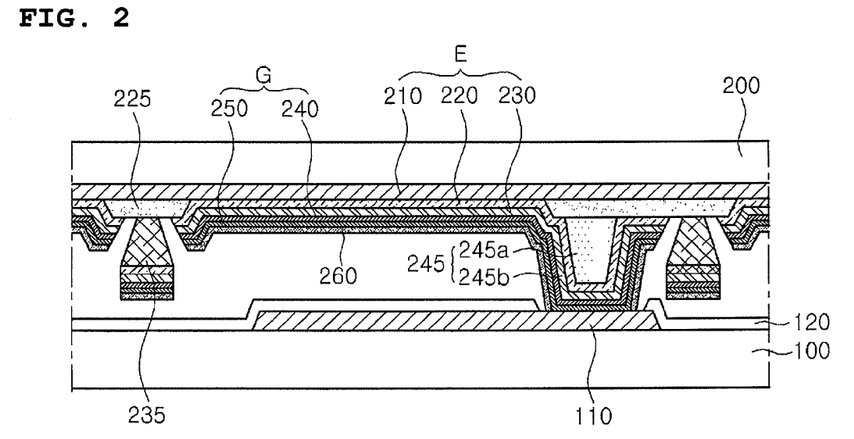
FIG. 2 is a cross-sectional view showing an OLED device according to a second embodiment of the present disclosure.

FIG. 2 is a cross-sectional view showing an OLED device according to a second embodiment of the present disclosure. The OLED device of the second embodiment has the same configuration as that of the first embodiment described above, with the exception of a gather buffer film. Accordingly, the description of the first embodiment to be repeated in the second embodiment of the present disclosure will be omitted. Also, the OLED device according to the second embodiment of the present disclosure will use the same reference numbers to refer to the same elements as those according to the first embodiment.

Referring to FIG. 2, the OLED device of the second embodiment includes first and second substrate 100 and 200, which are positioned at an interval and are sealed by a sealant, driver elements 110 arranged on the inner surface of the first substrate 100, organic light emission diode elements E arranged on the inner surface of the second substrate 200, and a gather electrode G disposed on the entire surface of the second substrate 200 involving the organic light emission diode elements E. Each of the organic light emission diode elements E includes a contact portion 245 which protrudes upward from part of the organic light emission diode element E and is electrically connected to the respective driver element 110. The gather electrode G is formed of an electrically conductive material and an oxidation-resistant electrically conductive material having an oxidative index lower than the electrically conductive material.

The material forming the gather electrode G, for example, the electrically conductive gather material has a high reactivity but a weak adhesion to the other material. In the end, the gather electrode G may swell or may cause a loosening defect.

To address this matter, the OLED device further includes a buffer-protective film 260 disposed on the second substrate 200 involving the gather electrode G. The buffer-protective film 260 may have the function of improving the adhesive strength between the gather electrode G and the organic light emission diode element E, and more specifically, the second electrode 230. Accordingly, the loosening defect of the gather electrode G is prevented by the buffer-protective film 260. Moreover, the buffer-protective film 260 may protect the gather electrode G from being contaminated.

Such a buffer-protective film 260 may expose the contact portion 245, in order to prevent the electrical contact defect between the driver 110 and the organic light emission diode element E. The buffer-protective film 260 can be formed from an electrically conductive metal or an insulating film. For the electrically conductive metal, any one among Al, Ca, Ag, and so on can be used. The insulating film can include any one among acryl group resin film, silicon nitride film, silicon oxide film, and so on. The buffer-protective film 260 may have a thickness minimal enough not to obstruct the moisture absorption of the gather electrode G. For example, the thickness of the buffer-protective film 260 may be below 1 μm.

As explained above, since the buffer-protective film prevents the gather electrode from being loosened and penetrated, the OLED device of the second embodiment which further includes the buffer-protective film can maintain a stable structure during a long lifespan.

Figure 3:
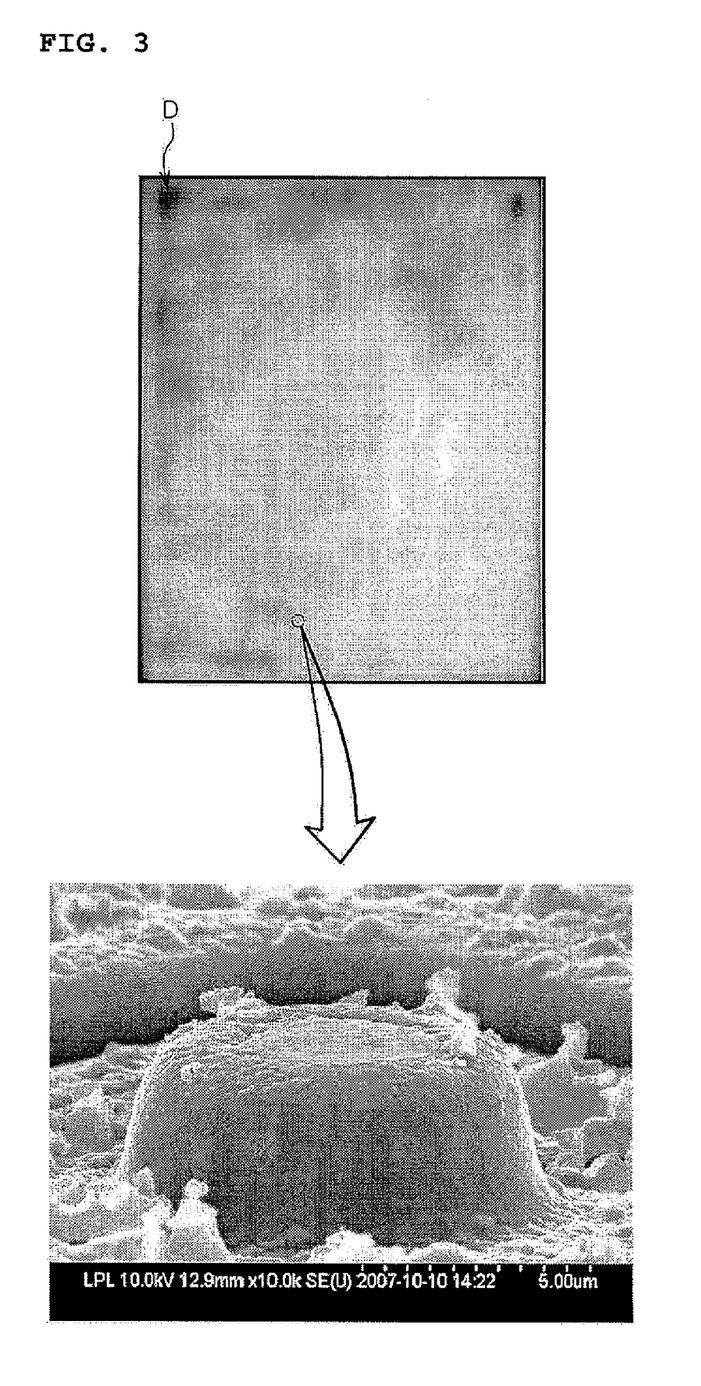
FIG. 3 is a photographic view showing the screen status of a driven OLED device according to a first comparable embodiment and an enlarged surface of an organic light emission diode element therein.

FIG. 3 is a photographic view showing the screen status of a driven OLED device according to a first comparable embodiment and an enlarged surface of an organic light emission diode element therein. The OLED device of the first comparable embodiment includes a gather electrode formed from an electrically conductive material and a second electrode formed from Al. The electrically conductive material includes only Ca.

Qualitative image defects such as dark spots and dark pixels caused by the oxidation of the gather electrode and the deterioration of surface quality of the gather electrode are evident in FIG. 3. This is representative of the case of the OLED device of the first comparable embodiment which including the gather electrode formed from only the electrically conductive material.

Figure 4:
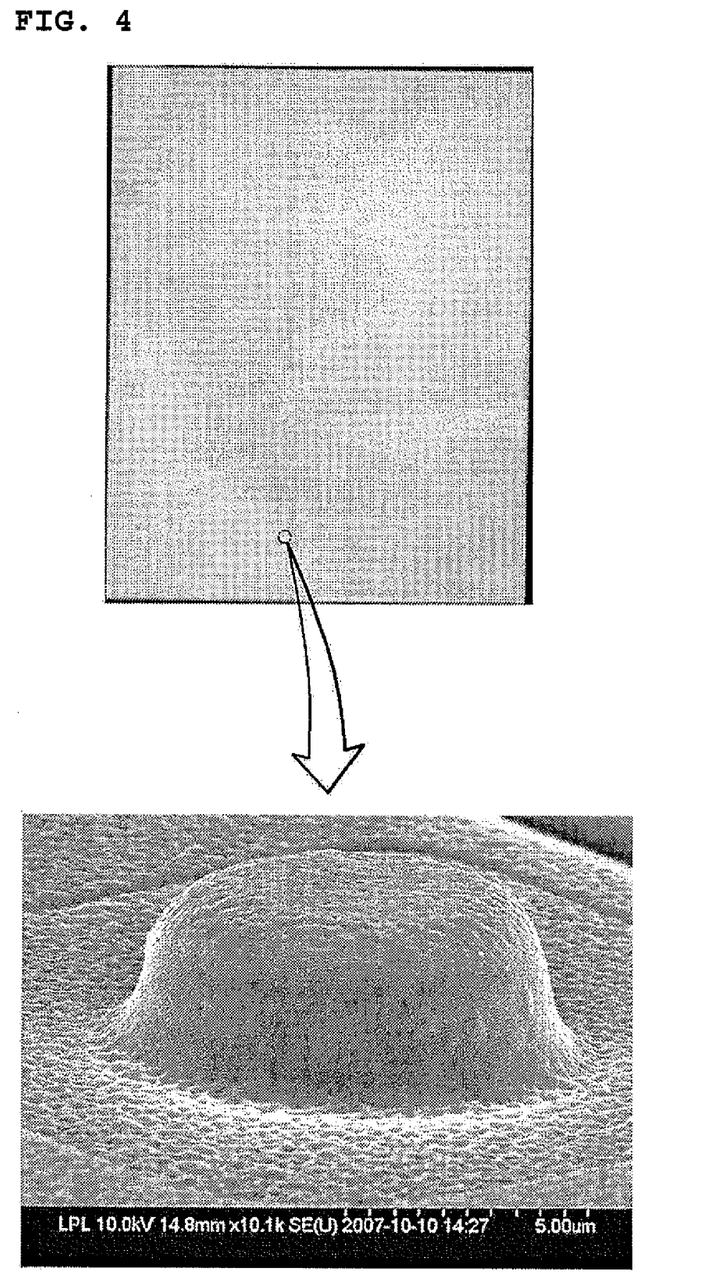
FIG. 4 is a photographic view showing the screen status of the driven OLED device according to a second comparable embodiment and an enlarged surface of an organic light emission diode element therein.
Figure 5:
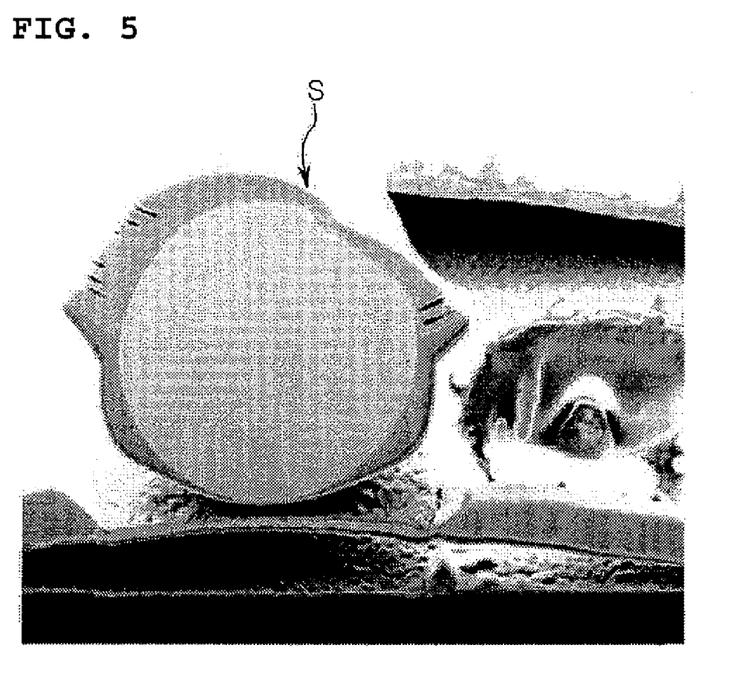
FIG. 5 is an enlarged photographic view showing the surface of the organic light emission diode element included in the OLED device according to another comparable embodiment.

FIG. 4 is a photographic view showing the screen status of the driven OLED device according to a second comparable embodiment and an enlarged surface of an organic light emission diode element therein. FIG. 5 is an enlarged photographic view showing the surface of the organic light emission diode element included in the OLED device according to another comparable embodiment.

The OLED device of the second comparable embodiment includes a gather electrode which is formed by stacking an electrically conductive material and an oxidation-resistant electrically conductive material. The electrically conductive material includes Ca, and the oxidation-resistant electrically conductive material includes Ag. Also, the second electrode of the organic light emission diode element is formed from Al.

When the gather electrode includes the oxidation-resistant electrically conductive material, it is evident that the qualitative image defects, such as dark spots and dark pixels, caused by the oxidation of the gather electrode and the deterioration of surface characteristic of the gather electrode are not generated on the screen of the OLED device, as shown in FIG. 4. However, Ag included in the gather electrode as the oxidation-resistant electrically conductive material may make it difficult to form a uniform thin film and may generate splashes as shown in FIG. 5. Due to this, the electric contact characteristic between the driver element and the organic light emission diode element can deteriorate. Moreover, Ag spreads to a portion of the gather electrode formed from Ca, thereby generating gaps in its thin film.

Figure 6:
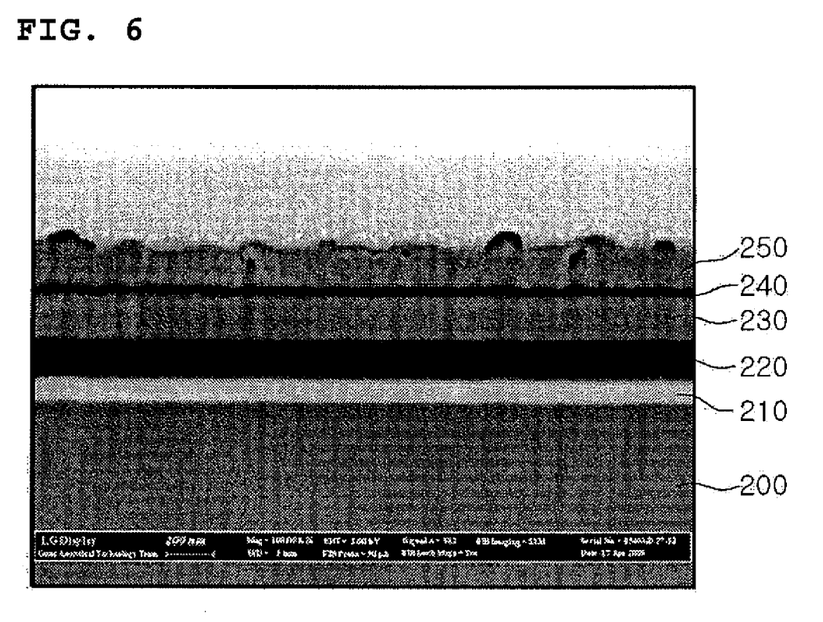
FIG. 6 is a cross-sectional view showing an organic light emission diode element included in an experimental OLED device according to the embodiment of the present disclosure.

FIG. 6 is a cross-sectional view showing an organic light emission diode element included in an experimental OLED device according to the embodiment of the present disclosure. A gather electrode G included in the experimental OLED device is formed in a stacked layer of first and second gather electrodes 240 and 250. The first gather electrode 240 is formed from an electrically conductive organic material which corresponds to the oxidation-resistant electrically conductive material. More specifically, the first gather electrode 240 includes LGC101 of LG Chemical Ltd which is used for the first electrical charge injection layer. The second gather electrode 250 is formed from Ca corresponding to the electrically conductive gather material. The electrically conductive organic material, which is used as the oxidation-resistant electrically conductive material forming the gather electrode, has a superior surface quality and does not result in splashes as shown in FIG. 6.

Figure 7:
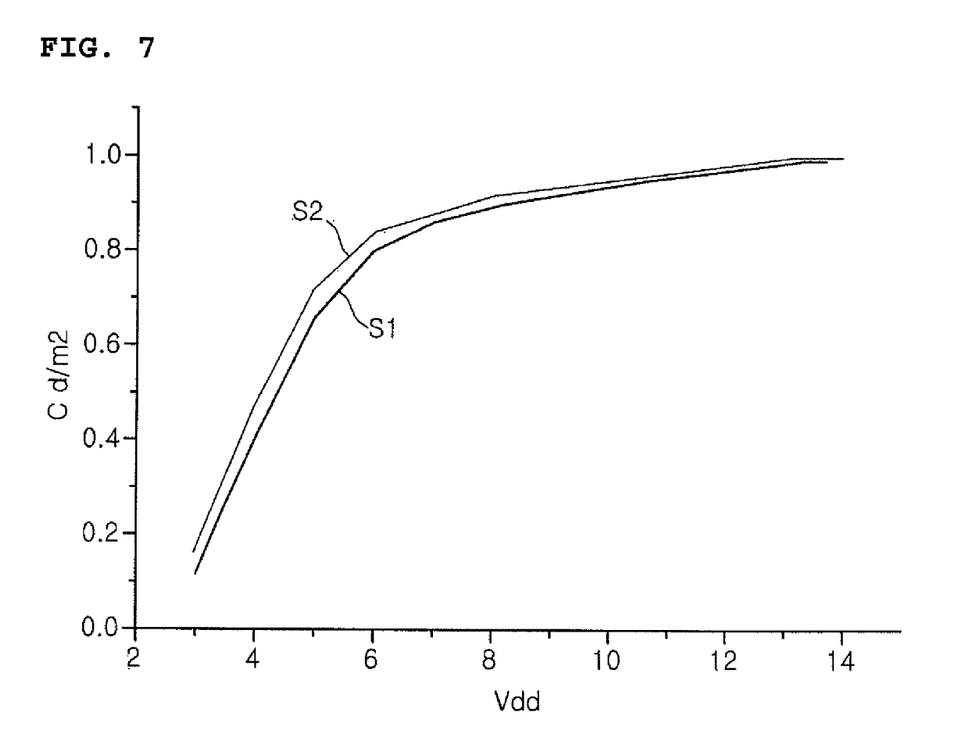
FIG. 7 is a cross-sectional view comparatively explaining the brightness characteristics of an experimental OLED device according to the embodiment of the present disclosure, before and after storage at high temperature and humidity.

FIG. 7 is a cross-sectional view comparatively explaining the brightness characteristics of an experimental OLED device according to the embodiment of the present disclosure, before and after storage at high temperature and humidity. As seen from FIG. 7, it is evident that the brightness characteristic S1 of the experimental OLED device after it is stored at high temperature and humidity has hardly varied in comparison with the brightness characteristic S2 of the experimental OLED device before it is stored.

Consequently, when the gather electrode, which includes the oxidation-resistant electrically conductive material, is applied to the OLED device, it can maintain the electrical conductivity in spite of its partial oxidation. This results in an improved image quality, longer lifespan, and greater reliability of the OLED device. Moreover, the oxidation-resistant electrically conductive material does not cause thin film defects such as splashes and makes it possible to easily form the thin film. Therefore, the productivity and manufacturing process stability of the OLED device can be improved and the element stability of the OLED device can be ensured.

As described above, the LCD devices according to the embodiments of the present disclosure remove internal moisture and oxygen by means of the gather electrode disposed on the organic light emission diode element, thereby improving their lifespan and reliability. Also, since the gather electrode includes the oxidation-resistant electrically conductive material, the OLED devices can prevent the deterioration of electrical contact characteristic between the driver element and the organic light emission diode element in spite of partial oxidation of the gather electrode. Moreover, the oxidation-resistant electrically conductive material does not cause the thin film defects such as splashes and makes it possible to easily form the thin film. As a result, the productivity of the OLED devices can be improved and the element stability of the OLED devices can be ensured. In addition, as the OLED devices further include the gather buffer film on the gather electrode, they can prevent the gather electrode from being loosened and contaminated.

It will be apparent to those skilled in the art that various modifications and variations can be made in the present disclosure. Thus, it is intended that the present disclosure cover the modifications and variations of this embodiment provided they come within the scope of the appended claims and their equivalents.

The invention claimed is:

1. An organic electro-luminescent display device comprising:
   a first electrode disposed on a first substrate;
   a buffer pattern disposed on the first electrode that defines a light emission region associated with a pixel;
   a pair of separators disposed on the buffer pattern positioned on opposite sides of the pixel;
   a protrusion member disposed on the buffer pattern within the light emission region defined by the pair of separators;
   an organic light emission layer disposed on the first electrode within the light emission region;
   a second electrode with a portion disposed on the organic light emission layer and a contact portion disposed on the protrusion member;
   a first gather electrode configured to directly contact an entire surface of the second electrode and formed of an oxidation-resistant electrically conductive material;
   a second gather electrode configured to directly contact an entire surface of the first gather electrode and formed of an electrically conductive gather material; and
   a second substrate, opposite to the first substrate that includes a driver element configured to directly contact the second gather electrode,
   wherein the first and second gather electrodes are disposed on at least opposite sides of the contact portion,
   wherein the electrically conductive gather material includes at least one of Ca, Sr, and CaO,
   wherein the oxidation-resistant electrically conductive material has an oxidative capacity lower than that of the electrical conductive gather material.

2. The organic electro-luminescent display device of claim 1, wherein the oxidation-resistant electrically conductive material includes one of a fluoride metal and an electrically conductive organic material.

3. The organic electro-luminescent display device of claim 2, wherein the electrically conductive organic material includes one of polypyrrole, polyaniline, polythiopene, "N,N'-Di(naphthalene-1-yl)-N,N'-diphenyl-benzidine" (NPB), "tris-8-hydroxyquinoline aluminum" (Alq3), and "4,4',4''-tris(3-methylphenyl-N-phenylamino)triphenylamine" (NTDATA).

4. The organic electro-luminescent display device of claim 2, wherein the fluoride metal includes one of lithium fluoride and magnesium fluoride.

5. The organic electro-luminescent display device of claim 1, further comprising a gather buffer film including one selected from the group consisting of aluminum, calcium, and silver and disposed on the gather electrode.

6. The organic electro-luminescent display device of claim 1, wherein the first and second gather electrodes are disposed on the second electrode and on the contact portion corresponding to a side surface of the protrusion member.

7. An organic electro-luminescent display device comprising:
   first and second substrates, opposite to each other at an interval, sealed by a sealant;
   driver elements arranged on an inner surface of the first substrate;
   organic light emission diode elements, arranged on an inner surface of the second substrate, each including a first electrode, a protrusion member, an organic light emission layer and a second electrode at least covering the protrusion member; and gather electrodes, each including a first gather electrode mixed with an oxidation-resistant electrically conductive material and a first electrically conductive gather material and configured to directly contact an entire surface of the second electrode and a second gather electrode formed of a second electrically conductive gather material and configured to directly contact an entire surface of the first gather electrode, wherein the first and second gather electrodes are disposed on at least opposite sides of a portion of the second electrode that covers the protrusion member, wherein the driver element is configured to directly contact the second gather electrode, wherein the second electrically conductive gather material includes at least one of Ca, Sr, and CaO, and wherein the oxidation-resistant electrically conductive material has an oxidative capacity lower than that of the electrically conductive gather material.

8. The organic electro-luminescent display device of claim 7, wherein the first electrically conductive gather material includes at least one selected from the group consisting of Al, Ag, Au, and Li.

9. The organic electro-luminescent display device of claim 7, wherein the gather electrode is disposed on a first portion of the second electrode corresponding to the inner surface of the second substrate and on a second portion of the contact portion corresponding to a side surface of the protrusion member.

* * * * *